(12) United States Patent
Park

(10) Patent No.: US 7,732,108 B2
(45) Date of Patent: Jun. 8, 2010

(54) METHOD FOR OPC MODEL GENERATION

(75) Inventor: O Seo Park, Hopewell Junction, NY (US)

(73) Assignee: Infineon Technologies AG, Munich (DE)

( * ) Notice: Subject to any disclaimer, the term of this patent is extended or adjusted under 35 U.S.C. 154(b) by 700 days.

(21) Appl. No.: 11/239,863

(22) Filed: Sep. 30, 2005

(65) Prior Publication Data
US 2007/0077504 A1 Apr. 5, 2007

(51) Int. Cl.
G03F 9/00 (2006.01)
(52) U.S. Cl. .............................. 430/30; 716/19; 716/21
(58) Field of Classification Search ................ 430/5, 430/30, 311; 716/19, 21
See application file for complete search history.

(56) References Cited

U.S. PATENT DOCUMENTS 6,602,728 B1 * 8/2003 Liebmann et al. ............. 438/16
2005/0210437 A1 * 9/2005 Shi et al. ...................... 716/19
2006/0141366 A1 * 6/2006 Parikh et al. .................. 430/5

OTHER PUBLICATIONS

Park, O. et al., "Model Based OPC Considering Process Window Aspects—a Study," Deep Submicron Technical Publication, www.mentor.com/dsm, Sep. 2002, 12 pp.

* cited by examiner

Primary Examiner—Kathleen Duda
Assistant Examiner—Brittany Raymond
(74) Attorney, Agent, or Firm—Slater & Matsil, L.L.P.

(57) ABSTRACT

A method for generating or refining an OPC model for use in wafer fabrication. A predetermined feature layout is used to prepare a mask for use in, for example, a photolithographic process. The mask is used to create structures corresponding to mask features on a semiconductor wafer using the mask. Measurements of the actual mask features and wafer features may then be assessed and correlated, and the results used to generate an OPC model or refine an existing one. In addition, the OPC may be used to simulate a fabrication operation by applying the OPC tool to a predetermined layout to produce a mask image and a wafer image, and then comparing the predetermined layout to the simulated wafer image to determine at least one fitness value.

17 Claims, 5 Drawing Sheets

METHOD FOR OPC MODEL GENERATION

TECHNICAL FIELD

The present invention relates generally to the field of semiconductor device fabrication, and more particularly to a method for refining an optical proximity correction (OPC) model and for optimizing the mask process window.

BACKGROUND

Semiconductor chips are used in a wide variety of electronic devices. A semiconductor chip is a small, often very small piece of a semiconductor material upon which various electric components have been fabricated and connected together to form integrated circuits. These circuits perform a variety of functions, such as memory or processing, in support of the semiconductor chip's role in the electronic device.

To form these circuits, the fabrication process typically begins with providing a substrate formed, for example, of silicon. The substrate material is usually sliced into a round, flat shape often called a wafer. A number of chips will typically be fabricated onto a single wafer. The surface of the wafer substrate is selectively treated with boron or phosphorus ions to impart the semiconductor characteristics. Insulating and conducting materials of various types are then layered onto the surface and formed into various shapes, for example by etching, to build small electrical such as transistors and capacitors and to connect those components to, or isolate them from each other.

These small components are frequently built in a series of steps, each of which deals with one or more of the layered materials referred to above and shapes them into one or more features. In a given step, however, many features are formed on the wafer surface, each feature being a part of one (or perhaps more) of the electrical components. These features are often arranged in an orderly fashion on the wafer surface, this arrangement being referred to as a layout. The layout takes into account the number of such features that will be required as well as how the components they are part of will eventually interconnect in order to function together. The designed layout, of course, attempts to make the most efficient use possible of the wafer surface. Millions of electronic components are formed on the wafer, which is typically cut up into a number of dice. Each die is then configured with appropriate external leads and encapsulated in a plastic package for use.

As mentioned above, a great number of features may be formed simultaneously on the wafer surface, although forming these features may itself require a number of process steps. One such process involves photolithography, and the subsequent selective etching of the wafer surface. (Note that as used herein, 'wafer surface' includes the topmost (outer) layer, or sometimes layers of the wafer involved in the fabrication. This may be but is not necessarily the surface of the substrate itself.) Lithography involves depositing a layer of material called photoresist (or simply 'resist') onto the wafer surface. When exposed to light, this resist changes properties, becoming either easier or harder to remove (depending on the type of resist used) in a subsequent solvent wash step. This is a useful process, because patterns of resist may be created by selective exposure to some form of light energy.

To create patterns on the resist layer that has been deposited onto the wafer surface, certain selected portions of it are exposed to light energy. To control the exposure, a mask is used. A mask is a typically flat plate forming a number of openings or transparent or translucent portions through which light may pass. Note that as used herein, the term 'mask' is intended to include a reticle or portions of a mask that illuminate only a portion of the wafer surface at any given time. Once the wafer surface has been selectively exposed using the mask, a solvent wash is used to remove unwanted portions of the resist and leave behind a pattern of resist structures.

An inspection may be performed at this stage to ensure that the resist structures have been properly formed. In any case, after the resist is patterned, a dry or wet etch step may then be used to remove portions of the wafer surface not protected by the resist, forming a recess or leaving a structure of the desired configuration. Some lateral etching of the walls of a recess to extend it somewhat may also occur, and this phenomenon may in fact be intended. The extent of the material etched away may be controlled by the type of etching agent used and the amount of time the wafer surface is exposed to it. If the photoresist structures are not needed for a subsequent step, for example further ion implantation, or following such a step, they are removed using an appropriate solvent. The desired features remain and the fabrication process continues.

Technological advances have permitted the formation of ever smaller electrical components, placed closer and closer together on the wafer surface. This can be of great commercial advantage because it permits the chips to be used in very capable devices that are nevertheless quite small. This trend has enabled, for example, the development of convenient personal computers, laptops, cell phones, and portable digital music players. The continuing demand for new and better devices has created industry pressure to fabricate even smaller and more powerful devices. This means that the electronic components formed on the wafer surface must get even smaller in size and be situated even more closely together.

This drive to smaller components and more dense layouts poses challenges for photolithography. As the size of the desired features becomes closer to the wavelength of the light used for exposure, optical effects such as diffraction may cause deformation of the surface structures. The increased density of the layout may also lead to the occurrence of proximity effects for similar reasons. Line shortening and corner rounding are examples of such deformation. Where such imperfections may not have had as significant impact on larger features, the performance of very small features may degrade unacceptably.

To counter these problems, various resolution enhancement techniques (RETs) have been developed. One of these techniques is optical proximity correction (OPC). OPC takes into account the proposed layout for electrical components on the wafer and determines how the mask might be altered to created the desired features. In other words, the mask is altered to ameliorate or eliminate the optical effects due to small component size or increased density. The size and shape of the mask openings may be, for example, adjusted, or sub-resolution assist features (SRAFs) strategically added. An SRAF is a mask opening that is too small to result in the creation of a corresponding feature on the surface, given the wavelength of light being used, but large enough alter the optical effects mentioned above, resulting in features that are more-properly formed.

The OPC process described above may vary, and the process is somewhat successful. Nevertheless, the persistent pressure for layouts with smaller components in more dense applications means that there remains a need for refinements in mask design and OPC enhancement techniques. The present invention provides just such a solution.

SUMMARY OF THE INVENTION

These and other problems are generally solved or circumvented, and technical advantages are generally achieved, by preferred embodiments of the present invention which is directed to a method of refining an OPC model for use in semiconductor wafer fabrication.

In accordance with a preferred embodiment of the present invention, the method of refining or generating an optical proximity correction (OPC) simulation tool for use in semiconductor fabrication includes the steps of designing a mask having at least one feature from a predetermined layout, preparing a mask according to the mask design, creating at least one structure corresponding to the at least one mask feature on a semiconductor wafer using the mask, measuring the at least one mask feature, measuring the at least one structure to determine its fidelity to the layout, comparing the measurements of the at least one mask feature and the at least one structure to determine mask error, and revising or generating the OPC tool based on the results of the comparison. The method may further include simulating a fabrication operation by applying the OPC tool to a predetermined layout to produce a mask image and a wafer image and comparing the predetermined layout to the simulated wafer image to determine at least one fitness value. These steps may be repeated several times to further refine the OPC.

A more complete appreciation of the present invention and the scope thereof can be obtained from the accompanying drawings that are briefly summarized below, the following detailed description of the presently-preferred embodiments of the present invention, and the appended claims.

BRIEF DESCRIPTION OF THE DRAWINGS

For a more complete understanding of the present invention, and the advantages thereof, reference is now made to the following descriptions taken in conjunction with the accompanying drawing, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention. The present invention will now be described with respect to preferred embodiments in a specific context. The invention may also be applied, however, in other contexts as well.

The present invention is directed to a method of optimizing mask design by improving the optical proximity correction (OPC) model. The method involves considering actual mask error in order to generate an OPC model or to refine an existing one. The method may further include the determination of a set of fitness values associated with the mask. The fitness values may be used to verify the OPC model and, in some cases, to optimize feature size corresponding to a specific feature set.

As alluded to above, in order to fabricate the components of a semiconductor device, the process generally begins with an examination of the required circuits and the available wafer surface are in order to design a component layout. Naturally, one of the goals of the layout is to use the available surface area as efficiently as possible. Some component parts will, for example, be linear (longer in one dimension than in the perpendicular dimension, as viewed from above) and, in an efficient layout, lined up more or less along side each other in a regularly-spaced-apart relationship. (See, for example, FIG. 1.) When this occurs, the set or group of spaced-apart features can be said to define a pitch, which is the sum of the lateral (shorter) dimension of one feature and the space between it and the one next to it.

Figure 1:
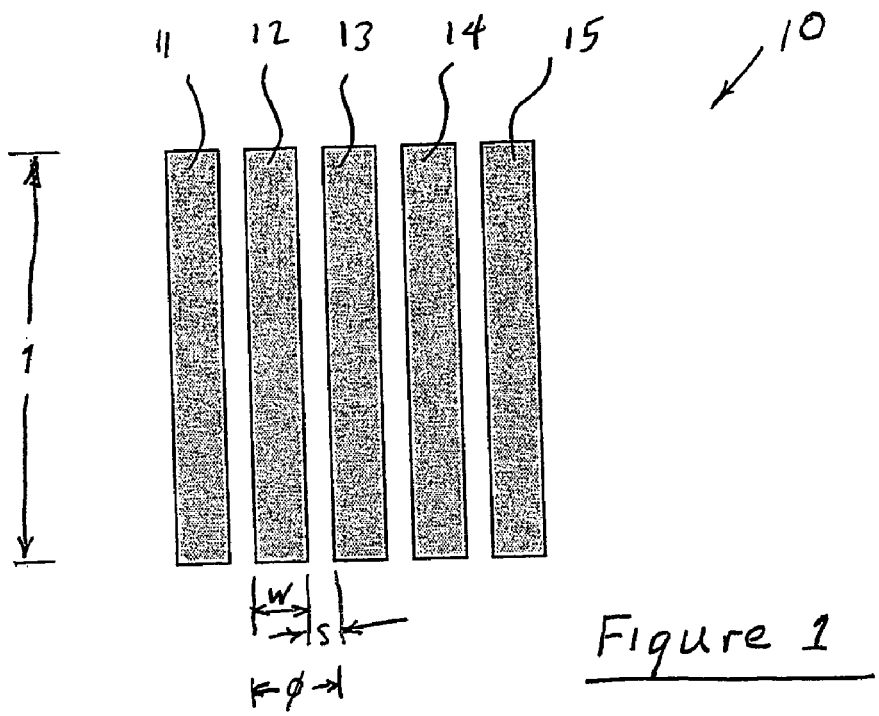
FIG. 1 is a simplified semiconductor feature layout for a feature set.

Component width, space width, and pitch are all useful parameters because the proximity effects mentioned above will vary with their respective values. These dimensions are illustrated in FIG. 1. FIG. 1 is a simplified semiconductor feature layout for the feature set 10. Naturally, an actual layout usually contains many more features, and may include features of differing size and shape and arranged in different ways. In feature set 10, however, it is for convenience assumed that all of the features are the same size and are equally spaced apart. Feature set 10 includes features 11 through 15, each having a length l and a width w. The space in between each of these features is s, meaning that the pitch $\phi$ associated with feature set 10 is equal to the sum of s and w.

In this example, which will be used to illustrate an embodiment of the present invention, width w is also a layout critical dimension (CD). The CD is a dimension used to gage the faithfulness of a particular production process to the specified layout dimensions. It is frequently at or near the smallest geometry achievable using a given technology. If the CD error is minimized, structures of larger dimensions should be acceptably formed as well. (More than one CD, however, may be defined.)

Figure 2:
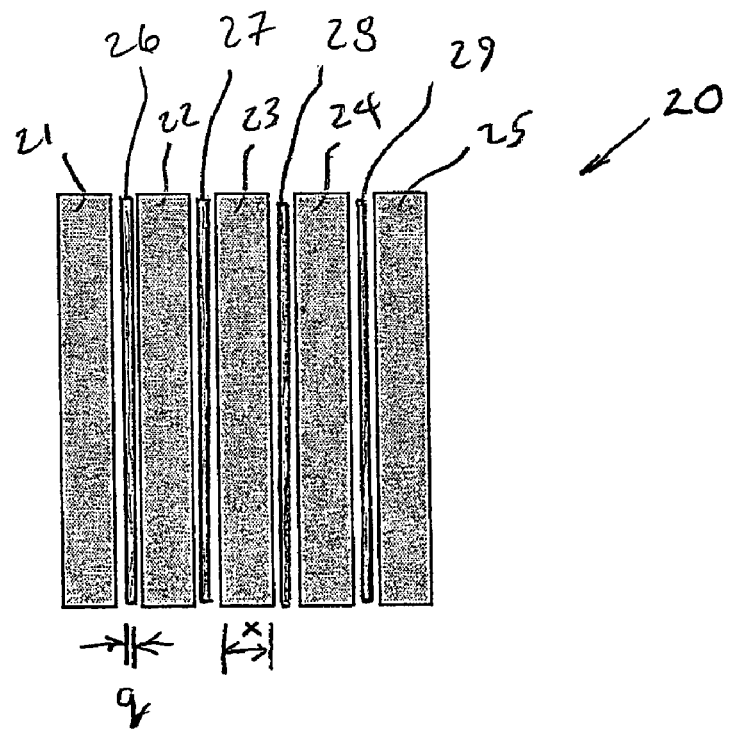
FIG. 2 is a simplified mask design associated with feature set of FIG. 1.

To replicate the feature set 10 using the photolithographic process, a mask must be prepared. As mentioned above, simply using the layout feature's dimensions and spacing may result in less than accurately formed features on the wafer due to optical effects. These optical effects are most pronounced when, as with feature set 10, the features in the layout have a dimension at or near the CD. FIG. 2 is a simplified mask design associated with feature set 10 of FIG. 1. In FIG. 2, each feature 11 through 15 associated with feature set 10 is represented in corresponding mask set 20 by a respective main feature 21 through 25. In addition, there are also sub-resolution assist features (SRAFs) 26 through 29.

Note that in FIG. 2, the main features and the SRAFs are opaque lines on a clear mask field. In another embodiment (not shown), the main features and the SRAFs will be openings (or transparent or translucent portions) on a dark mask. In this embodiment of FIG. 2, however, the regions of the wafer surface under main features 26 though 29 will not be illuminated while the regions elsewhere will. The SRAFs are small enough in the lateral dimension q relative to the wavelength of the light being used for illumination that they will not produce an image on the wafer surface. They will nevertheless assist in producing proper images for the main features. Note also that the main features 21 though 25 have a lateral dimension x for the same reason; simply using the width w for the main features may result in improperly formed surface features. Determining the proper dimensions x and q is naturally important, and is accomplished using an OPC methodology.

OPC may be accomplished using a rules-based strategy or a model-based strategy, or both. Rules-based OPC involves an examination of a proposed layout against a set of empirically-derived rules. That is, where certain layout configurations have been found in the past to be susceptible to mis-translation in certain ways, the mask design is deliberately adjusted. Instead of a literal rendition of the layout onto the mask, alterations that, based on experience, might be expected to result in a more accurate fabrication of the designed features are introduced. These alterations may include the exaggeration or shrinking of certain portions of the design dimensions, or the addition of sub-resolution assist features such as serifs or scatter bars. Rules-based OPC simply applies rules developed or extrapolated from previous experience. Its accuracy, of course, is limited by the degree to which the present design is similar to those of the past that were used to develop the rules.

Model-based OPC may provide a higher degree of accuracy, though it will also generally require a higher level of computing resources. In model-based OPC, one or more test wafers having somewhat varied layout configurations are produced. The results are measured to produce a set of models from which simulations may be run in order to evaluate varying OPC solutions for the present layout so that the best one may be chosen. Model-based OPC may be used to refine a mask design for even greater efficiency after rules-based OPC has already been applied. Nevertheless, prior OPC models have not used mask CD error for model refinement. The present invention provides an improved OPC model calibration strategy that involves consideration of actual mask CD.

Figure 3:
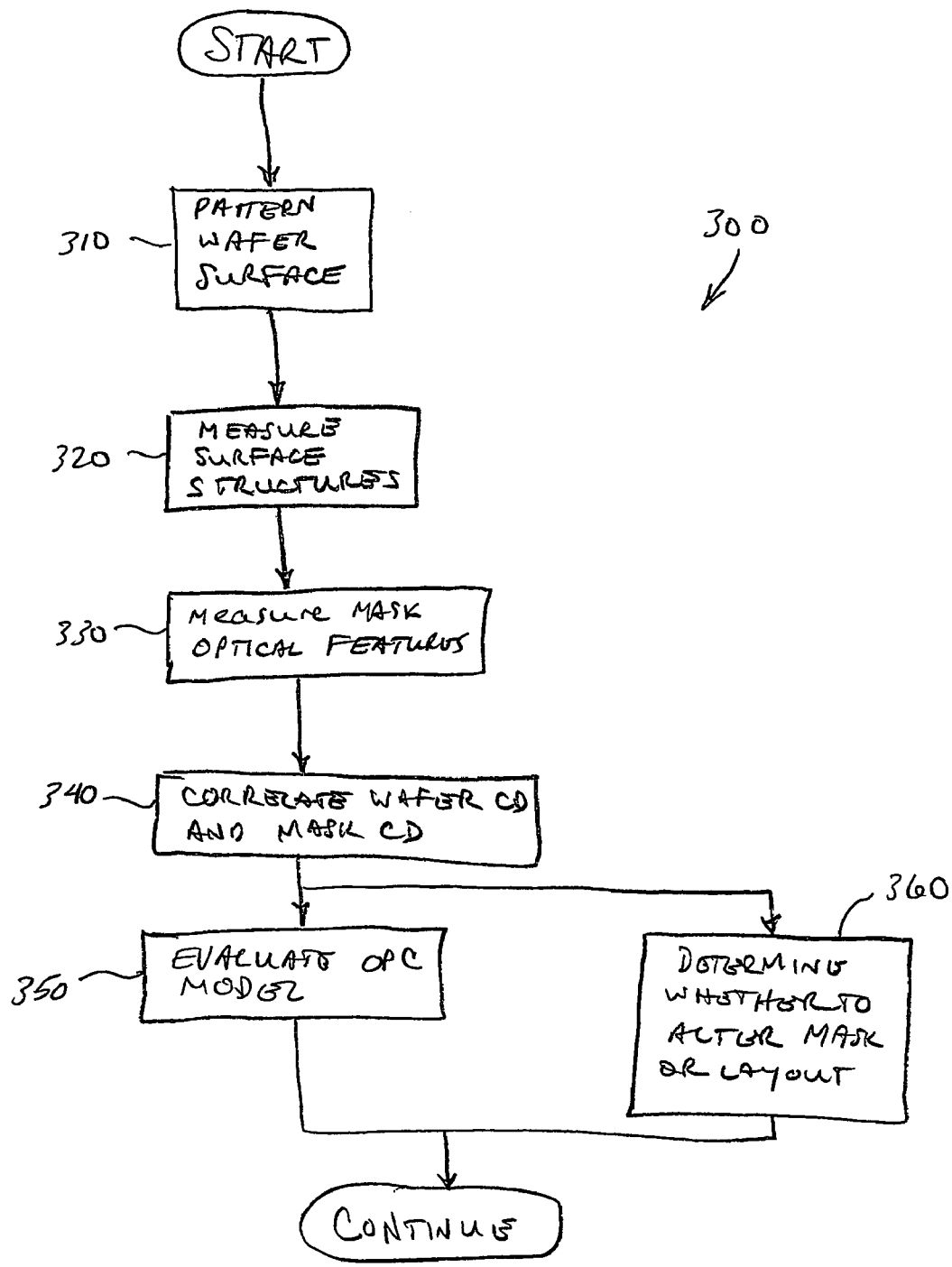
FIG. 3 is a flow diagram illustrating a method according to an embodiment of the present invention.

FIG. 3 is a flow diagram illustrating a process 300 according to an embodiment of the present invention. At START it is presumed that a design layout has been prepared, and that at least one corresponding mask design has also been done. Note that this may be an actual production layout, but more typically is a layout to be used only (or mainly) to accomplish the OPC generation or refinement according the present invention. Preferably, this initial mask design has taken into account one or more known resolution enhancement techniques such as rules-based OPC. While not necessary in practicing the present invention, this initial step as set forth in the embodiment of FIG. 3 may enhance its effectiveness. The mask is then used to pattern the surface of a wafer using known methods (step 310).

The patterning step 310, as used herein, may include simply exposing the photoresist and removing undeveloped portions using an appropriate solvent. (Note, however, that either positive or negative photoresist may be used.) The patterning step may also include the selective etching step (not shown) that will actually create structures on the wafer surface itself. Again, 'wafer surface' is used herein to indicate the surface currently being modified, which may or may not be the base substrate itself In any of these embodiments, the result will be a wafer surface populated by structures associated with the mask currently in use.

A representative number of the surface structures are then measured (step 320). This will usually involve structures that are designed at a particular CD and associated spaces so that an actual pitch may be determined. In another embodiment, the wafer measuring step involves measurements including structures exhibiting a different CD or pitch. In accordance with the present invention, corresponding measurements of the mask optical features are also taken (step 330).

The optical features of the mask, of course, are the mask openings or transparent or translucent portions formed to permit the passage of light in order to selectively modify the characteristics of the photoresist that has been deposited in the wafer surface. Typically, these dimensions are generally known from the mask construction process itself (not shown), but may be obtained more precisely by measurements made when the mask is being used to pattern the wafer surface. Optical features may include, in this context, sub-resolution assist features (which will have no corresponding surface structure). The wafer measurements and the mask measurements are then correlated (step 340). The correlation results may then be used to reevaluate the OPC model (step 350). A determination may then be made as to whether mask or design adjustments are in order (step 360). If so, the process may be repeated (any number of times) with the improved OPC tool and mask design.

In this manner, the OPC model is refined or generated based on the actual mask CD rather than simply on a comparison between the layout and the wafer CD. Another embodiment of the present invention is illustrated in FIG. 4.

Figure 4:
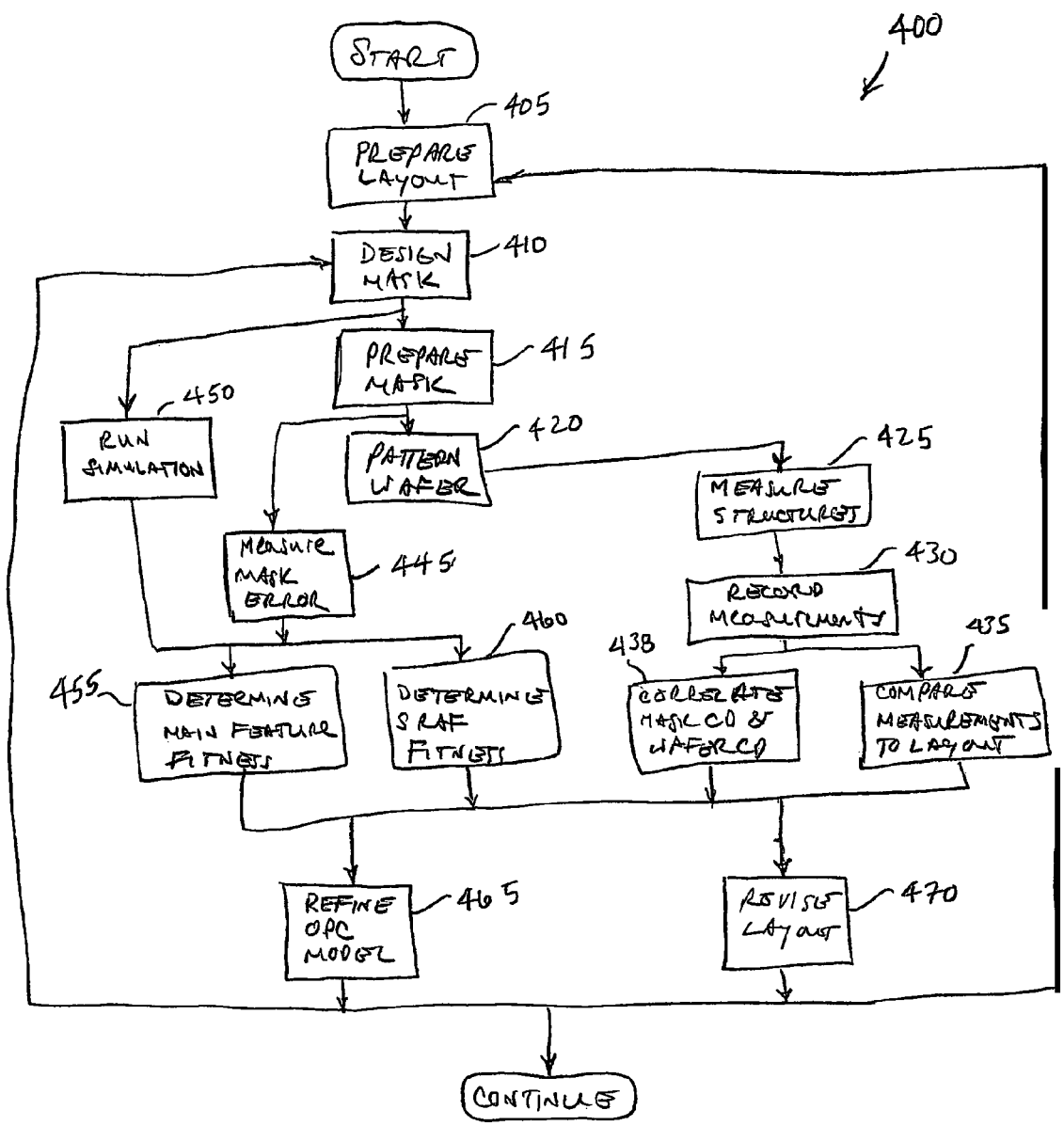
FIG. 4 is a flow diagram illustrating a method according to another embodiment of the present invention.

FIG. 4 is a flow diagram illustrating a method 400 according to another embodiment of the present invention. At START it is presumed that the function of a chip has been selected and that appropriate circuits have been designed. The method 400 begins with the preparation of a design layout (step 405) that includes the desired circuits and attempts to make the most efficient use of the available wafer surface. Next, a mask design is prepared (step 410), taking into account the prepared layout and any OPC rules that are to be applied at this stage. The application of rule-based OPC at this point is preferred but not required, and as a matter of design preference its application may be limited. The mask design at this stage may be referred to as the preliminary mask design, as its configuration is likely to be altered (although alteration of the preliminary mask design is not required). In some embodiments, the preliminary mask design is not based entirely or at all on the design layout, but rather is developed as a test design. In this case it preferably includes a number of feature sets (for example feature set 20 illustrated in FIG. 2), each having properties that distinguish it from other sets (such as a different CD). In yet another embodiment, a number of mask designs (and hence masks) could be used to provide the same diversity.

In accordance with an embodiment of the present invention, a mask according to the preliminary mask design is then prepared (step 415), then it is used to pattern a semiconductor wafer (step 420). Again, the pattern of interest may be that produced by photoresist structure, or after performing etching and resist-removal steps (not shown), structures formed of the underlying material. This of course provides a physical sample from which to evaluate the performance of one or more aspects of the mask design. One or more measurements may then be taken (step 425). Each of these measurements is of course recorded (step 430) and compared to the layout (step 435) to determine whether and to what extent it is different.

Similarly, mask error is measured (step 445), preferably for a variety of different size features. Mask CD error, of course is not the same as the corresponding wafer CD error due to the effects of the mask error enhancement factor. As in the embodiment of FIG. 3, however, mask CD and wafer CD may be correlated (step 438) and the results used to further refine the OPC model.

In addition to producing a structure-bearing wafer, the mask design is evaluated using an OPC model simulation (step 450). The simulation, of course, may be run at the same time as the actual mask and wafer is being produced, or either before or after. In any event, the actual error ($ERR_m$) and the simulated error ($ERR_s$) are used to determine a main feature fitness value (step 455), which is equal to their difference ("error" being in comparison to the design intent expressed in the layout). Again, it is preferred that a fitness value be determined for a number of different main features. Similarly, an SRAF fitness value may also be determined (step 460) for a number of different SRAF feature sizes using there the fitness value=($ERR_m$-$ERR_s$). Since the fitness represents a variance between the simulation image and the layout, a lower value is more desirable.

Figure 6:
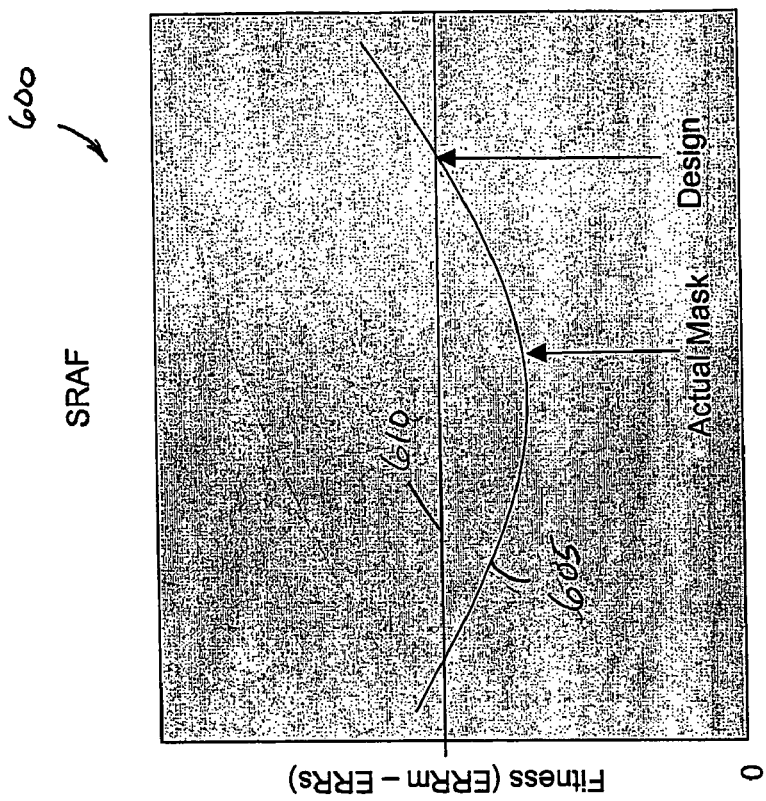
FIG. 6 is a chart illustrating a comparison of fitness and feature size for semiconductor fabrication mask SRAFs.
Figure 5:
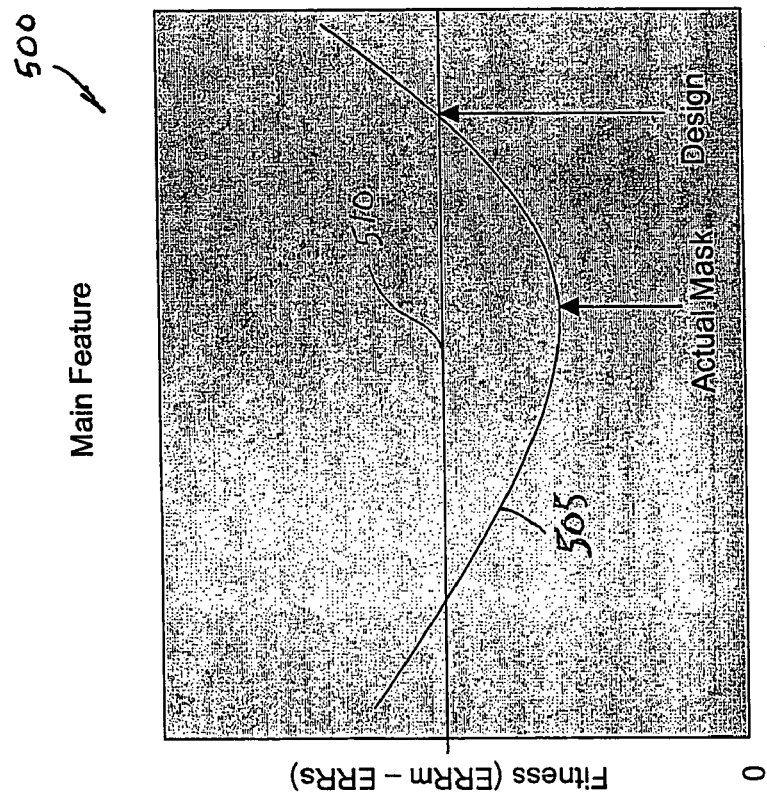
FIG. 5 is a chart illustrating a comparison of fitness and feature size for semiconductor fabrication mask main features.

Application of the method according to the present invention is illustrated in FIGS. 5 through 8. FIG. 5 is a chart 500 illustrating a comparison of fitness and feature size for semiconductor fabrication mask main features. In this illustration, the design main feature size has been shown to yield a certain fitness indicated by the horizontal line 510. As trend line 505 indicates, however, lower fitness value is obtained where the actual mask main feature size has a somewhat lower value. Similarly, FIG. 6 illustrates a similar concept in relation to the SRAFs. FIG. 6 is a chart 600 illustrating a comparison of fitness and feature size for semiconductor fabrication mask main SRAFs. Here again, the designed SRAF size yields a fitness of the value indicated by horizontal line 610, while trend line 605 shows an actual mask SRAF having a somewhat smaller size will produce a lower fitness value. As should be apparent from FIGS. 5 and 6, however, an optimum main feature and SRAF size exist; the fitness value does not continue to drop as the main features and SRAF are reduced in size.

Figure 7:
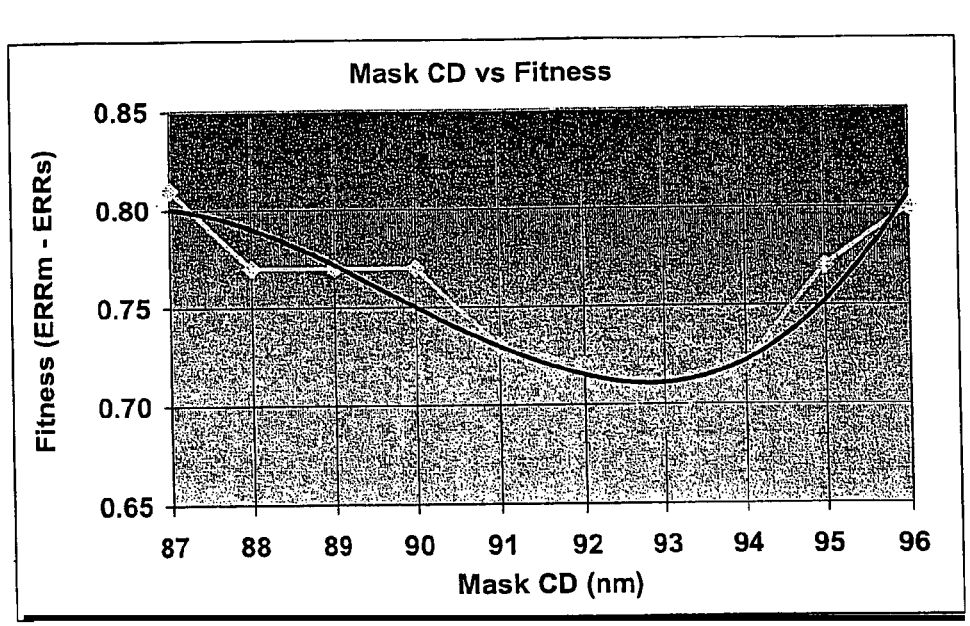
FIG. 7 is chart illustrating a comparison of fitness and feature size for semiconductor fabrication mask main features.
Figure 8:
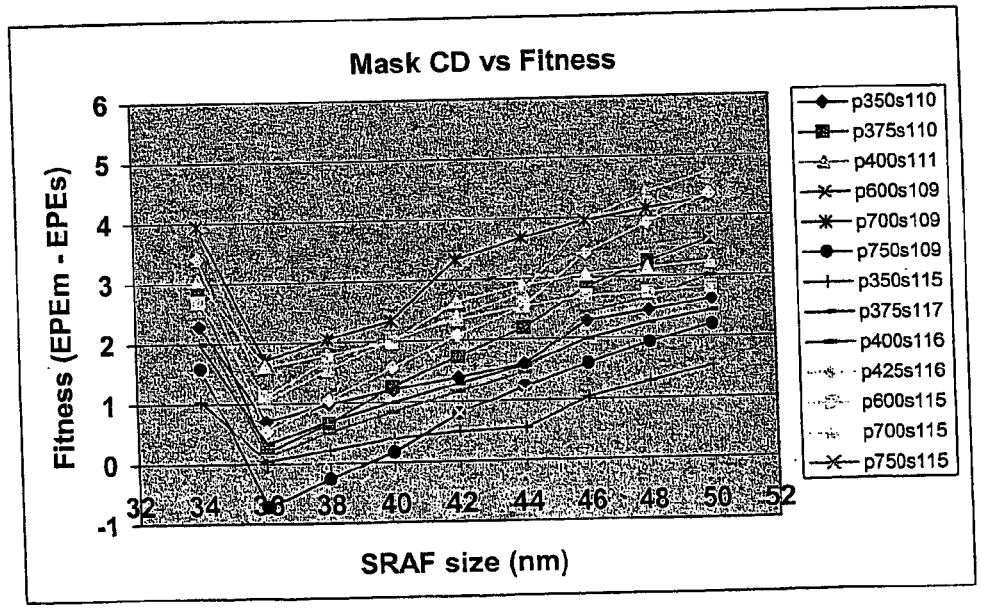
FIG. 8 is a chart illustrating a comparison of fitness and feature size for semiconductor fabrication mask SRAFs at varying pitches.

FIG. 7 is a chart 700 illustrating a comparison of fitness and feature size for semiconductor fabrication mask main features similar to FIG. 5 but populated with experimentally obtained data. Similarly, FIG. 8 is a chart 800 illustrating a comparison of fitness and feature size for semiconductor fabrication mask SRAFs. In FIG. 8, experimental data has been obtained for a number of different pitch values so as to obtain a result more reliable over a range of design conditions.

Returning to the embodiment of FIG. 4, using the values obtained for the main features and the SRAFs, the OPC model can be refined (step 465). This assumes, of course, that refinement is considered necessary. In this regard, the refinement step 465 is considered to have been performed even if the OPC already in use is simply validated. In the usual case, however, some adjustment to the OPC model will be desirable. At this point a new mask design may be both produced (sep 410) and simulated (step 450), and the remaining steps repeated once or a number of times in order to further refine the OPC model.

In addition, as optimum main feature and SRAF sizes have been determined, the layout itself (or the future production layout) may be modified according to this determination (step 470). If this occurs, the process may also return to the step 410, and then a new mask produced and simulated. Naturally, both feature-size adjustment and model refinement may be performed. These steps may also be performed more than one additional iteration. That is, for example, if a new main feature size and a refined OPC model are applied, the resulting fitness values may be used to re-evaluate the main feature and SRAF sizes, and the OPC model may be further refined. After appropriate adjustments, the process may be repeated yet again. At any point, of course, the method may simply be brought to an end. This may occur after a certain number of iterations have been performed, or when the designed feature sizes are found to have the optimum fitness value. Finally, note that the steps in the methods described above may be performed in any logical order and not simply in the order in which they have been here presented. Some steps may be omitted in some of the embodiments.

Although the present invention and its advantages have been described in detail, it should be understood that various changes, substitutions and alterations can be made herein without departing from the spirit and scope of the invention as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of refining an optical proximity correction (OPC) simulation tool for use in semiconductor fabrication, said method comprising the steps of:
   designing a mask having at least one feature from a predetermined layout;
   preparing a mask according to the mask design;
   simulating a fabrication operation to generate a simulated mask image according to the mask design;
   comparing the predetermined layout to the simulated mask image to determine at least one simulated mask error ($ERR_s$);
   creating at least one structure corresponding to the at least one mask feature on a semiconductor wafer using the mask;
   measuring the at least one mask feature;
   measuring the at least one structure to determine its fidelity to the layout;
   comparing the measurements of the at least one mask feature and the at least one structure to determine at least one actual mask error ($ERR_m$);
   comparing the simulated mask error ($ERR_s$) to the actual mask error ($ERR_m$) to determine at least one fitness value;
   determining, based at least in part on the at least one fitness value, whether to modify the mask design; and
   revising the OPC tool based on the results of the comparison of at least one of comparing the predetermined layout step or comparing the measurement step.

2. The method of claim 1, wherein a plurality of fitness values are determined for a plurality of assessed structures.

3. The method of claim 2, wherein the plurality of assessed structures includes structures of different size.

4. The method of claim 1, wherein the mask comprises a plurality of optical features.

5. The method of claim 4, wherein the plurality of optical features includes at least one main feature and at least one sub-resolution feature.

6. The method of claim 5, wherein the at least one sub-resolution feature is associated with the at least one main feature.

7. The method of claim 5, wherein a fitness value is determined for the at least one sub-resolution feature.

8. The method of claim 4, wherein the at least one structure comprises a first plurality of structures arranged in a regular spaced apart relationship having a first pitch, and further comprising the step of determining a fitness value for the optical features corresponding to the first plurality of structures.

9. The method of claim 4, wherein the at least one structure comprises at least a second plurality of structures arranged in a regular spaced apart relationship, the at least second plurality of structures having a second pitch that is different from the first pitch, and further comprising the step of determining a fitness value for the optical features corresponding to each plurality of structures having a different pitch.

10. The method of claim 9, further comprising the step of altering the mask design based on a comparison of the determined fitness values.

11. A method of forming a semiconductor device, said method comprising the steps of:

designing a mask having at least one feature from a predetermined layout, the mask being designed using an optical proximity correction (OPC) simulation tool;

preparing a mask according to the mask design;

simulating a fabrication operation to generate a simulated mask image according to the mask design;

comparing the predetermined layout to the simulated mask image to determine at least one simulated mask error ($ERR_s$);

creating at least one structure corresponding to the at least one mask feature on a semiconductor wafer using the mask;

measuring the at least one mask feature;

measuring the at least one structure to determine its fidelity to the layout;

comparing the measurements of the at least one mask feature and the at least one structure to determine at least one actual mask error ($ERR_m$);

revising the OPC tool based on both the results of comparing the predetermined layout step and comparing measuring the at least one structure step;

using the revised OPC tool to design a second mask;

coating a resist material over a second semiconductor wafer;

directing radiation through the second mask to irradiate portions of the resist;

exposing portions of the second semiconductor wafer below the resist layer, the portions of the semiconductor wafer being exposed being related to the portions of the resist that were irradiated; and processing exposed portions of the semiconductor wafer.

12. The method of claim 11, further comprising the steps of comparing the simulated mask error ($ERR_s$) to the actual mask error ($ERR_m$) to determine at least one fitness value, and determining whether to alter the layout prior to revising the OPC tool, wherein the step of revising the layout is based at least in part on the at least one fitness value.

13. The method of claim 11, wherein a plurality of fitness values are determined for a plurality of assessed structures.

14. The method of claim 13, wherein the plurality of assessed structures include structures of different size.

15. The method of claim 14, wherein the plurality of optical features includes at least one main feature and at least one sub-resolution feature.

16. The method of claim 15, wherein the at least one sub-resolution feature is associated with the at least one main feature.

17. The method of claim 15, wherein a fitness value is determined for the at least one sub-resolution feature.

* * * * *